(12) United States Patent
Adam et al.

(10) Patent No.: US 9,496,282 B2
(45) Date of Patent: Nov. 15, 2016

(54) STRUCTURE AND METHOD TO REDUCE CRYSTAL DEFECTS IN EPITAXIAL FIN MERGE USING NITRIDE DEPOSITION

(71) Applicant: International Business Machines Corporation, Armonk, NY (US)

(72) Inventors: Thomas N. Adam, Slingerlands, NY (US); Kangguo Cheng, Slingerlands, NY (US); Ali Khakifirooz, Los Altos, CA (US); Alexander Reznicek, Troy, NY (US); Raghavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/093,658

(22) Filed: Dec. 2, 2013

(65) Prior Publication Data

US 2015/0155307 A1 Jun. 4, 2015

(51) Int. Cl.
  *H01L 21/84* (2006.01)
  *H01L 27/12* (2006.01)
  *H01L 29/78* (2006.01)
  *H01L 21/308* (2006.01)

(52) U.S. Cl.
  CPC ......... *H01L 27/1211* (2013.01); *H01L 21/845* (2013.01); *H01L 21/3086* (2013.01); *H01L 29/785* (2013.01)

(58) Field of Classification Search
  CPC ............. H01L 27/1211; H01L 21/845; H01L 21/3065; H01L 21/823431; H01L 21/82821; H01L 27/0886; H01L 27/0924; H01L 27/10826; H01L 29/49791; H01L 29/66795; H01L 29/7831; H01L 29/785

USPC ........................ 438/197, 311, 425, 712, 689; 257/E21.09
  See application file for complete search history.

(56) References Cited

U.S. PATENT DOCUMENTS

| | | | | |
|---|---|---|---|---|
| 4,505,025 A | * | 3/1985 | Kurosawa | H01L 21/31055 257/506 |
| 5,358,891 A | * | 10/1994 | Tsang | H01L 21/76205 148/DIG. 50 |
| 6,921,700 B2 | | 7/2005 | Orlowski et al. | |
| 6,962,843 B2 | | 11/2005 | Anderson et al. | |
| 7,354,831 B2 | | 4/2008 | Orlowski | |
| 7,851,865 B2 | | 12/2010 | Anderson et al. | |
| 7,910,482 B2 | | 3/2011 | Stephens et al. | |
| 2004/0173844 A1 | * | 9/2004 | Williams | H01L 29/4236 257/329 |
| 2006/0105565 A1 | * | 5/2006 | Liu et al. | 438/633 |
| 2007/0287256 A1 | | 12/2007 | Chang et al. | |
| 2008/0303096 A1 | * | 12/2008 | Schulz | 257/365 |

(Continued)

OTHER PUBLICATIONS

Boye, Carol, et al.—"E-Beam Inspection for Combination Use of Defect Detection and CD Measurement"—IEEE 2012—ASMC 2012.

(Continued)

*Primary Examiner* — Galina Yushina
(74) *Attorney, Agent, or Firm* — Scully, Scott, Murphy & Presser, P.C.; Steven J. Meyers

(57) ABSTRACT

FinFET devices and methods of making the same. A structure includes: a substrate with a buried insulator, a plurality of fins over a recessed buried insulator, and a nitride material filing recessed spaces between the plurality of fins, wherein the plurality of fins remain uncovered by the nitride, and wherein the nitride material does not contact the bottom of the plurality of fins.

11 Claims, 10 Drawing Sheets

(56) References Cited

U.S. PATENT DOCUMENTS

| | | |
|---|---|---|
| 2009/0101978 A1* | 4/2009 | Anderson et al. ............ 257/365 |
| 2009/0206446 A1 | 8/2009 | Russ et al. |
| 2010/0187578 A1* | 7/2010 | Faltermeier ....... H01L 29/66636 257/288 |
| 2011/0227162 A1 | 9/2011 | Lin et al. |
| 2012/0104472 A1 | 5/2012 | Xu et al. |
| 2012/0126375 A1 | 5/2012 | Wang et al. |
| 2012/0193751 A1* | 8/2012 | Kawasaki et al. ............ 257/506 |
| 2012/0238061 A1 | 9/2012 | Fischer et al. |
| 2013/0161729 A1* | 6/2013 | Xie ................... H01L 29/66795 257/329 |
| 2013/0316513 A1* | 11/2013 | Basker et al. ................ 438/400 |

OTHER PUBLICATIONS

Applicant: International Business Machines Corporation, Inventor: Thomas N. Adam, et al.
U.S. Appl. No. 14/093,646, filed Dec. 2, 2013, entitled: "Structure and Method to Reduce Crystal Defects in Epitaxial Fin Merge Using Nitride Deposition".

* cited by examiner

STRUCTURE AND METHOD TO REDUCE CRYSTAL DEFECTS IN EPITAXIAL FIN MERGE USING NITRIDE DEPOSITION

CROSS-REFERENCE TO RELATED APPLICATION

This application is related to application Ser. No. 14/093,646, the entire contents of which are incorporated herein by reference.

BACKGROUND

1. Field of the Invention

The present application relates to a semiconductor structure and a method of forming the same. More particularly, the present application relates to a FinFET device and a method for making the same.

2. Related Art

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. A gate dielectric can be formed in direct physical contact with each vertical sidewall of the at least one semiconductor fin and, optionally, in direct physical contact with a topmost surface of the semiconductor fin. A gate conductor can be formed on the gate dielectric and straddling a portion of the at least one semiconductor fin. FinFETs can increase the on-current per unit area relative to planar field effect transistors.

Referring first to FIG. 1, there is illustrated a device, which includes from top to bottom, a bulk silicon substrate 13, an insulator layer 12 and a handle substrate 10. The device shown in FIG. 1 can be used to make a FinFET device or equivalent structure. As shown with reference to FIG. 2, in preparation for producing a FinFET device, an insulator layer 14 is deposited on top of the bulk silicon substrate 13. This can be done using various techniques known in the art, such as by thermal oxidation or PECVD oxide deposition. Accordingly, FIG. 3 illustrates the device of FIG. 2 after it has undergone one of the various know techniques known in the art, such as an SIT process or direct patterning. The various steps and processes necessary for fin formation are known, and are omitted herein.

FIG. 3, from top to bottom, includes remnants of the insulator layer 14, hereinafter referred to as the insulator material layer 15, a plurality of fins 18 dispersed on top of the insulator layer 12, which in turn is over the handle substrate 10. Collectively the handle substrate 10 and the buried insulator layer 12 may be referred to herein as a semiconductor-on-insulator (SOI) substrate. The handle substrate 10 provides mechanical support for the buried insulator layer 12 and any other layer or material that can be stacked thereupon.

In some embodiments of the present application, the handle substrate 10 can be a semiconductor material, where the term "semiconductor" as used herein in connection with the semiconductor material of the handle substrate 10 denotes any semiconducting material including, for example, Si, Ge, SiGe, SiC, SiGeC, InAs, GaAs, InP or other like III/V compound semiconductors. Multilayers of these semiconductor materials can also be used. In one embodiment, the handle substrate 10 is silicon. In some embodiments, as for example, those involving the stacking of multiple layers, the handle substrate 10 is a non-semiconductor material including, for example, a dielectric material and/or a conductive material.

In some embodiments, the handle substrate 10 can have the crystal orientation of {100}, {110}, or {111}. Other crystallographic orientations besides those specifically mentioned can also be used in the present application. The handle substrate 10 can be a single crystalline semiconductor material, a polycrystalline material, or an amorphous material. In some embodiments, the handle substrate 10 can be processed to include semiconductor regions having different crystal orientations.

The buried insulator layer 12 can be a crystalline or non-crystalline oxide or nitride. In one embodiment, the buried insulator layer 12 is an oxide such as, for example, silicon dioxide. The buried insulator layer 12 can be continuous or it may be discontinuous. When a discontinuous buried insulator region is present, the insulator region can exist as an isolated island that is surrounded by semiconductor material.

The insulator layer 14, and by extension the insulator material layer 15, (which as stated is the remnant of insulator layer 14), is located over the plurality of fins 18, can be a crystalline or non-crystalline oxide. In one embodiment, the insulator material layer 15 can be an oxide, such as for example, silicon oxide.

Preferably, the buried insulator layer 12 will be a buried oxide layer, for example, and as stated, silicon dioxide.

The SOI substrate may be formed utilizing standard processes including for example, SIMOX (separation by ion implantation of oxygen) or layer transfer. When a layer transfer process is employed, an optional thinning step may follow the bonding of two semiconductor wafers together.

As such, there is a need to improve FinFET devices and methods for making the same.

SUMMARY OF THE INVENTION

One aspect of the invention includes a method for making a FinFET device. The method includes: providing a substrate with a buried insulator, providing a plurality of fins over the buried insulator, and filling spaces between the plurality of fins with nitride material, where the surface of the fin remains uncovered by the nitride material.

Another aspect of the invention includes a FinFET device. The FinFET device includes: a substrate with a buried insulator, a plurality of fins over the buried insulator, and a nitride material filing spaces between the plurality of fins, where the plurality of fins remain uncovered by the nitride.

Yet another aspect of the invention includes a method for making a FinFET device. The method includes: providing a substrate with a buried insulator, providing a plurality of fins over the buried insulator, performing a recess on the buried insulator, filling recessed portions of the buried insulator with nitride material, where the recessed portions are between the plurality of fins with nitride material, where the nitride material does not contact the bottom of the fin, and where the surface of the fin remains uncovered by the nitride material.

Yet another aspect of the invention includes a FinFET device. The FinFET device includes: a substrate with a buried insulator, a plurality of fins over a recessed buried insulator, and a nitride material filing recessed spaces between the plurality of fins, where the plurality of fins remain uncovered by the nitride, and where the nitride material does not contact the bottom of the plurality of fins.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1:
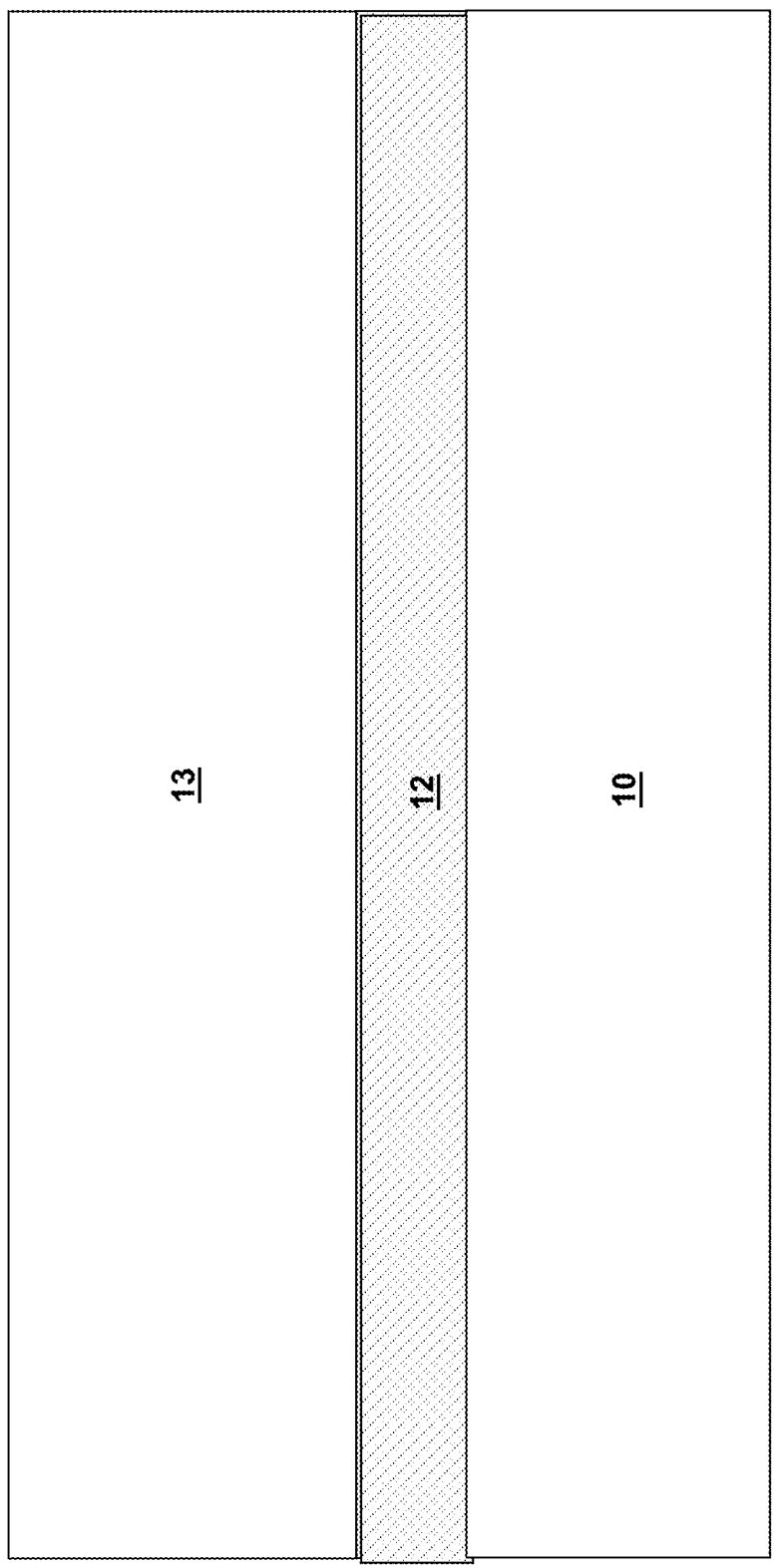
FIG. 1 illustrates an initial semiconductor structure known in the prior art.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

The various embodiments of the disclosure describe a structure and method for eliminating crystalline defects in the epitaxial merge material of fins in FinFET devices and equivalent devices; for example, an n-FET region that employs phosphorous dopant in the epitaxial merge material and oxide insulator region(s) in between the fins will have pronounced crystalline defects form therein during epitaxial merging. Defects can be dislocations and/or planar defects in the epitaxial material. One reason for the more pronounced defect formation during epitaxial merge of nFET fins may be phosphorous poisoning of the oxide. Nitride is deposited in between the spaces of fins and/or within recesses of an insulator region or regions that are in between the fins; the nitride suppresses crystalline defect formation during epitaxial merge of the fins in the source drain region.

Figure 4:
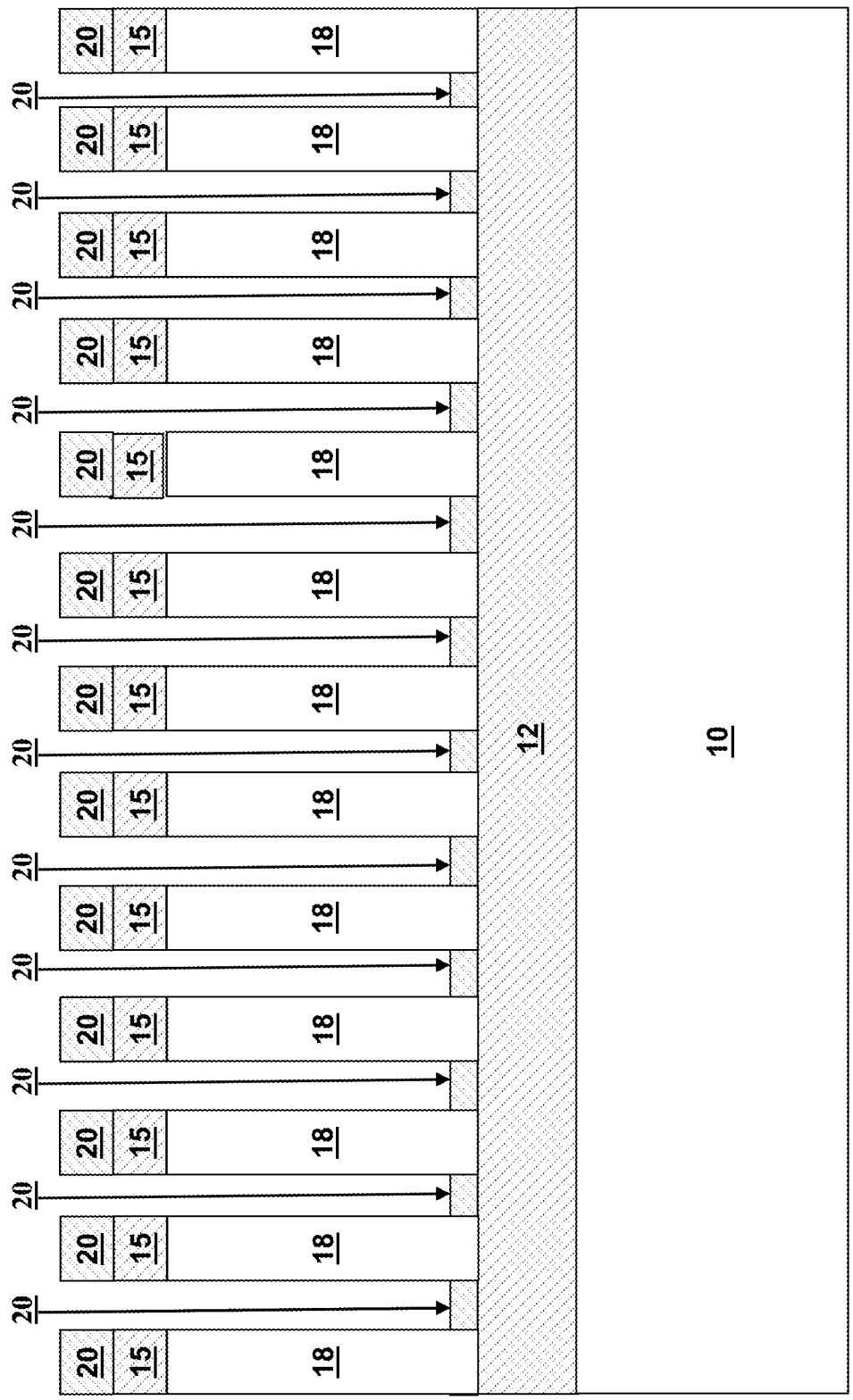
FIG. 4 illustrates an initial semiconductor structure in accordance with an embodiment of the present invention.

Referring now to FIG. 4, an embodiment of the present disclosure is shown. A FinFET device is shown with the insulator material layer 15 over the plurality of fins 18, where nitride material 20 is deposited in between spaces between each semiconductor fin 18. The nitride material 20 can be deposited by directional deposition, for example high density plasma deposition, such that it covers surfaces parallel to the plasma source, without causing excessive perpendicular deposition, i.e. minimizing deposition of nitride material along the sidewalls of the fins 18. The nitride material 20 can be any kind of silicon based nitride material, like $Si_xO_yN_z$. Preferably, the material will be silicon nitride, $Si_3N_4$.

Figure 2:
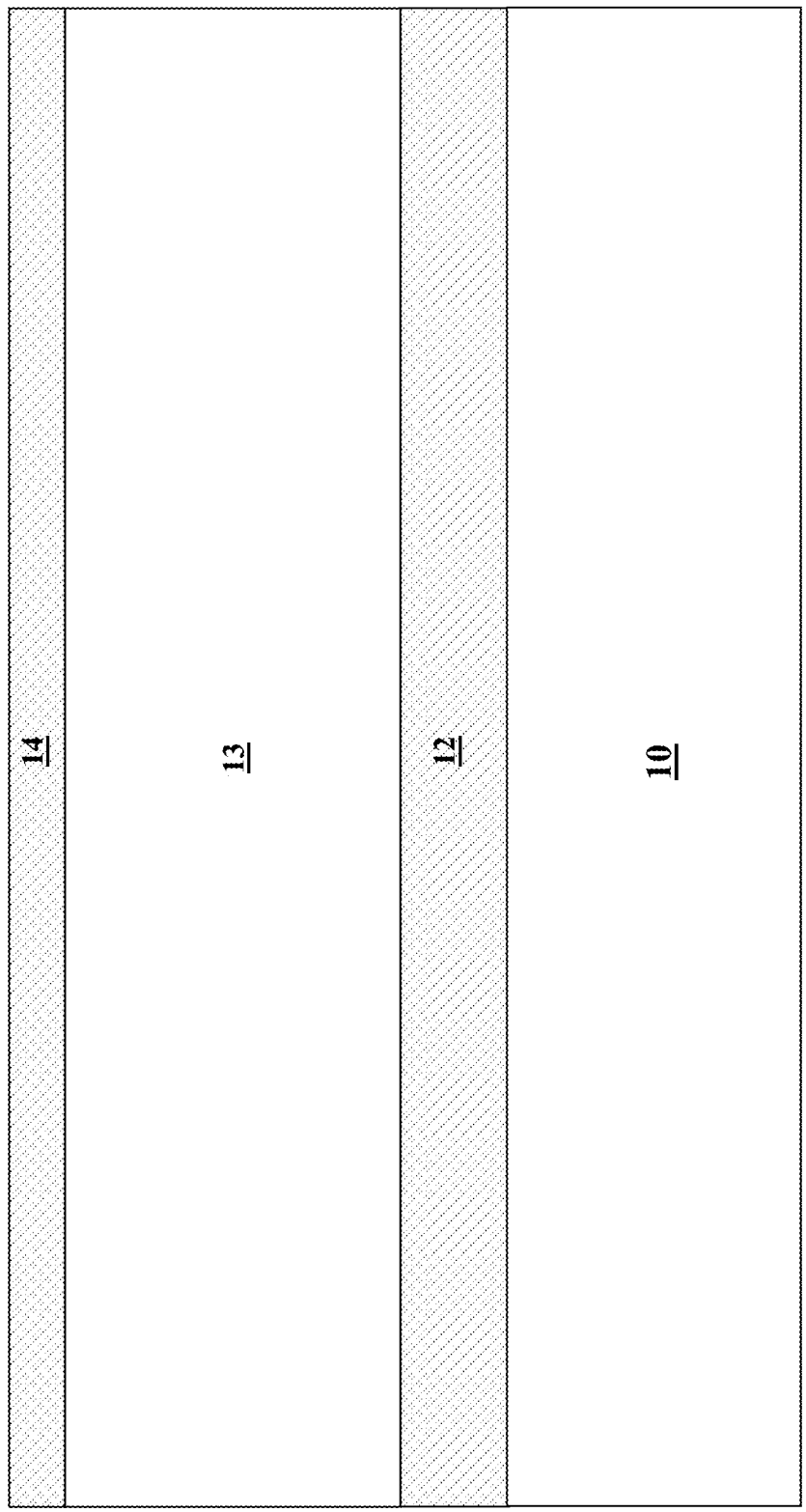
FIG. 2 illustrates an initial semiconductor structure known in the prior art.
Figure 3:
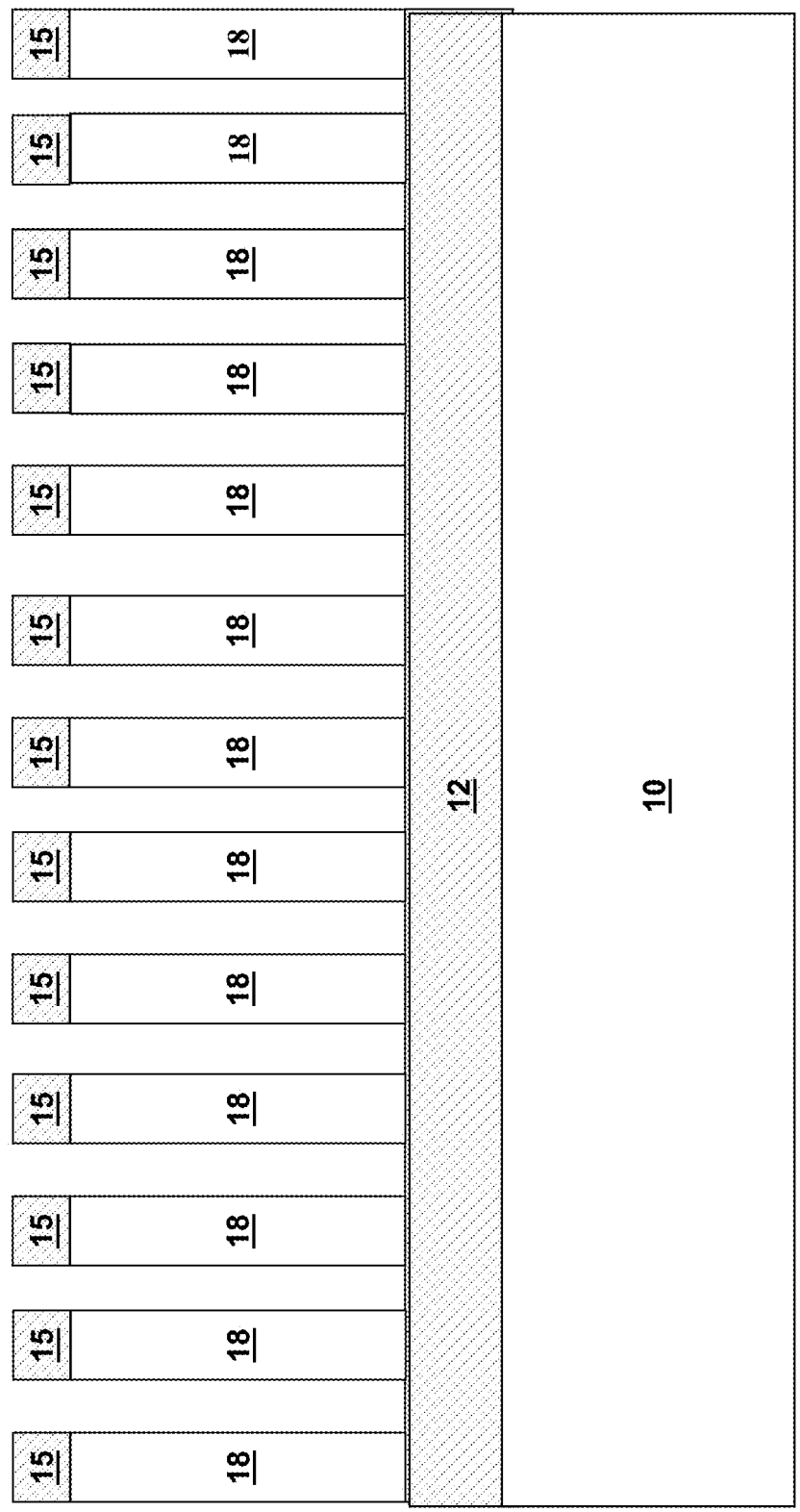
FIG. 3 illustrates an initial semiconductor structure known in the prior art that can be employed in at least one embodiment of the present disclosure.

The nitride material 20 is deposited such that it occupies recesses in the buried insulator 12. The recesses in the insulator layer 12 are not shown in FIG. 2, but it should be noted that the recesses will be along the surface of the insulator 12. The recesses can be deep or shallow. For instance, by way of a non-limiting example, in the 14 nm or 10 nm technology context, a shallow trench can range from 5 nm-15 nm in depth and a deep trench can range from 20 nm-50 nm in depth. The trench width is dependent on, and cannot exceed, the spacing between the fins.

The directional nitride deposition can be done so that the nitride material 20 is deposited in between the fins 18 in a manner which occupies and partially or completely fills the recesses in the spaces between the fins 18. The deposition can be such that the bottom of each of the fins 18, i.e. the portion of the fins that makes contact with the insulator region 12, does not make any substantial mechanical contact or no mechanical contact at all, with the nitride material 20.

The buried insulator layer 12 can be recessed as a result of certain process steps prior to the epitaxial deposition process; for example, fin formation, gate spacer formation, multiple wet treatments and an additional pre-epitaxy fin surface clean by the use of hydrofluoric acid or dry etching processes (SiCoNi). This will result in gauging and recessing of the buried insulator layer 12 in between the fin.

Figure 5:
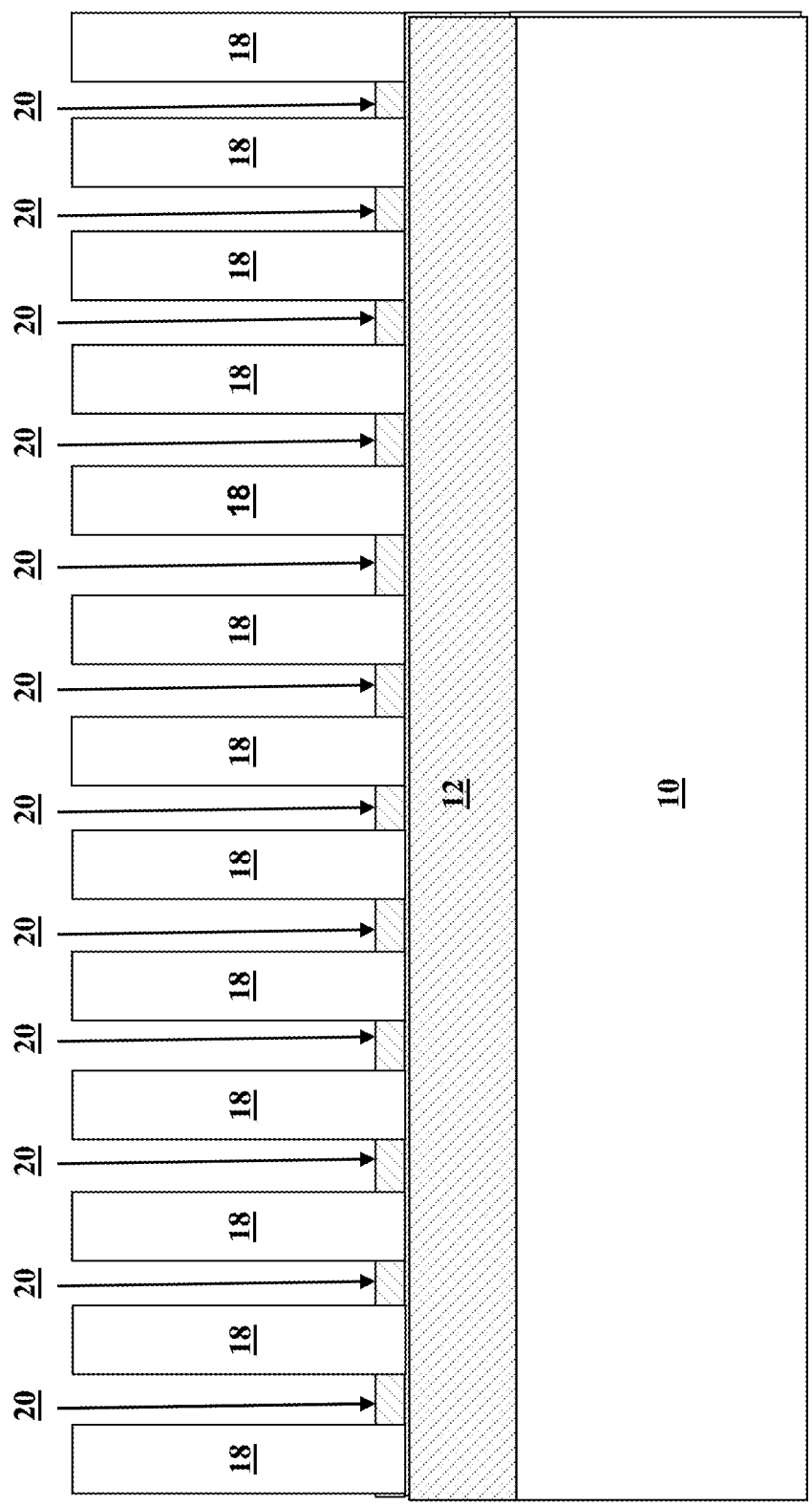
FIG. 5 illustrates a semiconductor structure in accordance with an embodiment of the present invention.

Referring now to FIG. 5, an etch process is employed to remove insulator material layer 15. The insulator layer can be removed, for example, using an etch process, such as aqueous hydro-fluoric acid (HF). The aqueous hydro-fluoric acid will etch the insulator material layer 15 from the top of the device shown in FIG. 5, and by extension, the nitride material 20 located on top of the insulator material 15 is lifted off the fins 18. The removal of the insulator material layer 15, and by extension the nitride material located on top of the insulator material layer 15, will result in the top of the fins 18 being exposed, i.e. the nitride material 20, does not cover the top of any of the fins 18.

The directional deposition of the nitride material 20 can be done, as stated, so that only a portion of each of the sidewalls of the fins is contacted by the nitride material 20; however, there may be a need to reduce this contact and a need to remove eventual residual nitride material (not shown in Figures) occupying some portions of the sidewalls of the fins 18. This can be achieved by removing eventual residual nitride material from the sidewalls of the fins 18. The removal can be done by an etching process, such as isotropic reactive ion etching, or more preferably, a timed wet etch step. A non-limiting example for a wet etch is applying hot phosphoric acid to the nitride contacting the fin-sidewalls so that any possible nitride residue is removed therefrom.

Usually, there is no nitride residue present on the sidewalls. In cases where there is nitride residue on the fin sidewall, it is much thinner than the deposited nitride material 20 filling spaces between the fins 18. As such, the wet etch step may be timed, so it removes all residual nitride material from the sidewalls, but leaves a substantial amount of the deposited nitride material 20 intact.

Preferably, the removal will ensure that the nitride material 20 will directly-mechanically contact no more than half of the surface area of the sidewall of the fins 18. By extension, this will result in the height of the nitride material 20 being less than the height of the nitride material 20 of the fins 18.

By way of a non-limiting example, employing the above techniques to a device where the insulator layer is a buried oxide layer with 145 nm in thickness, the fins are 50 nm in height, the fin pitch is 40 nm, the spacing between the fins is 30 nm, some portions of the insulator that are recessed to 5 nm in depth, and the nitride material being deposited is 10 nm in initial depth, with an eventual residue of about 1-2 nm on the sidewalls, can result in the recessed portions being totally filled by nitride material with an additional 1-2 nm contacting the fin sidewalls. The directional deposition will ensure that all or a substantial portion of the nitride material deposits in between the fins and in the recessed portion of the insulator, and eventual residual nitride on the sidewalls can be removed by the etch processes described above, for example the timed wet etch, which will remove 1-2 nm of deposited nitride material and all of the eventual nitride residue. The result will be 5 nm of nitride material in the 5 nm recess, with only 2 nm contacting the fins sidewalls.

Alternatively, in another embodiment of the present disclosure, the recessing of the insulator layer 12 is done by an etch process, such as wet etching, or more preferably, reactive ion etching. This can result in deeper recesses that permit the nitride material 20 to be deposited more firmly in the recesses.

By way of a non-limiting example, employing the above techniques to a device where the insulator layer has deeper recesses (as described above) and is a buried oxide layer with 145 nm in thickness, the fins are 50 nm in height, the fin pitch is 40 nm, the spacing between the fins is 30 nm, some portions of the insulator in between the fins that are recessed are 20 nm in depth, and the nitride material being deposited is 25 nm in initial thickness, with residual nitride of about 1-2 nm on the sidewalls, can result in the recessed portions being totally filled by nitride material with an additional 1-2 nm contacting the fin sidewalls. The directional deposition will ensure that all or a substantial portion of the nitride material is deposited in between the fins and in the recessed portion of the insulator, and the residual nitride removal by the etch processes described above, for example the timed wet etch, will remove 1-2 nm of deposited nitride material and all of the nitride residue. The result will be 20 nm of nitride material in the 20 nm recesses, with only 3 nm outside the recesses and contacting the fins sidewalls.

Figure 6:
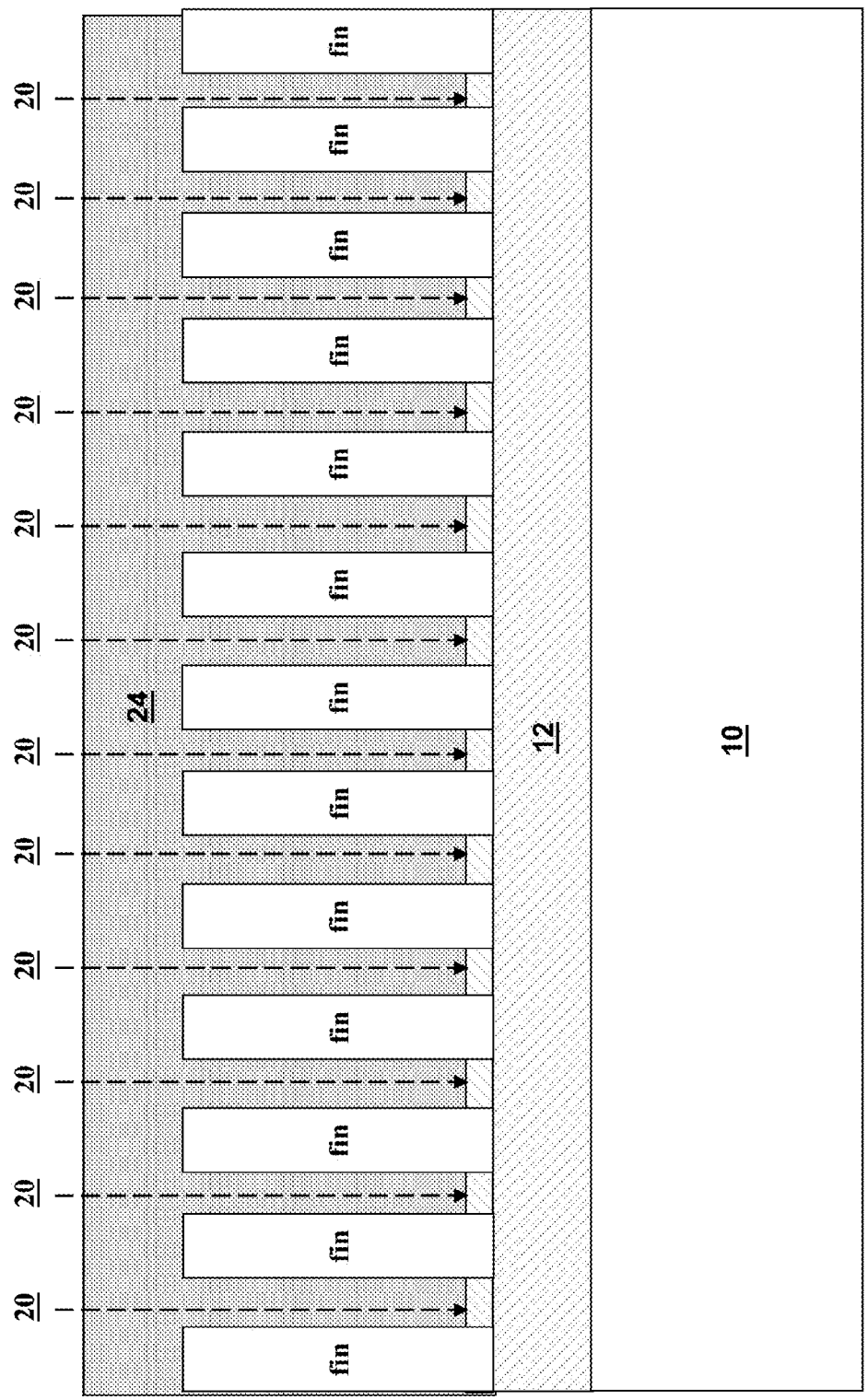
FIG. 6 illustrates a semiconductor structure in accordance with an embodiment of the present invention.

Referring now to FIG. 6, after the nitride material 20 is deposited, and after gates are formed by depositing a gate dielectric followed by a gate electrode on upper surfaces of the fins 18, the fins 18 can be merged by an epitaxial material 24 using an epitaxial process. As stated above, the deposited nitride material 20 will prevent the formation of crystalline defects, such as dislocations or stacking faults, in the epitaxial material, as it grows along the nitride surface.

Generally, epitaxial growth, grown, deposition, formation, process etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking Referring now to FIG. 7, an embodiment of the present disclosure is shown. A FinFET device is shown with an insulator material layer 15 over a plurality of fins 18, where the plurality of fins 18 are over an insulator layer 12, which itself is over a handle substrate 10. Recesses 22 for portions of the insulator layer 12 that are in between the plurality of fins 18 are shown. The nature of the recesses will be discussed in more detail below.

Figure 7:
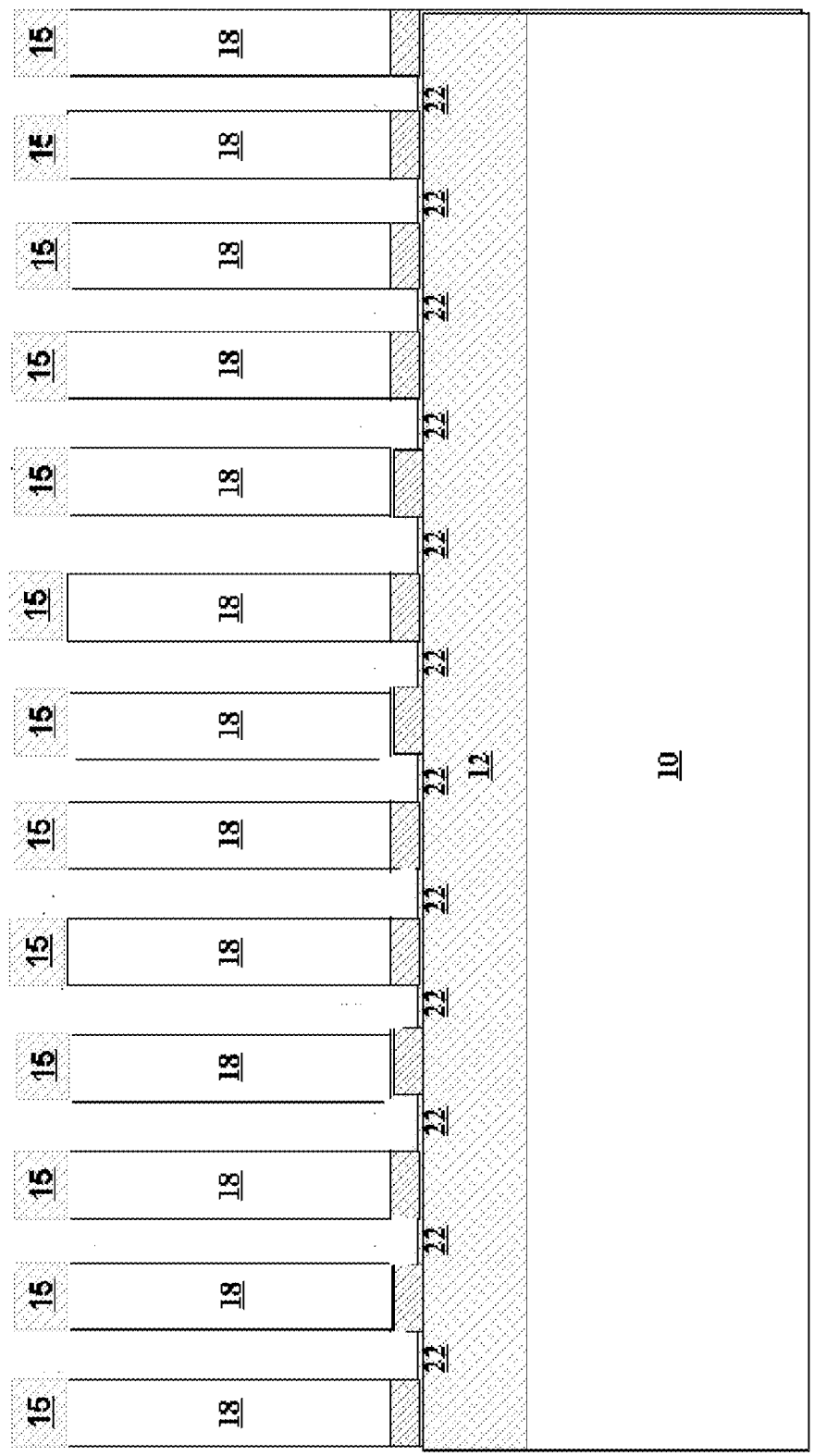
FIG. 7 illustrates a semiconductor structure in accordance with an embodiment of the present invention.

It should be noted that the explanation as to fin formation and the deposition of insulator layer 14 have been omitted with reference to FIG. 7 and onward. It should be further noted that when a discussion refers to the insulator material layer 15, as in the previous embodiments, this refers to insulator material that is the remnant of insulator layer 14, which is altered as a result of a fin formation process.

Figure 8:
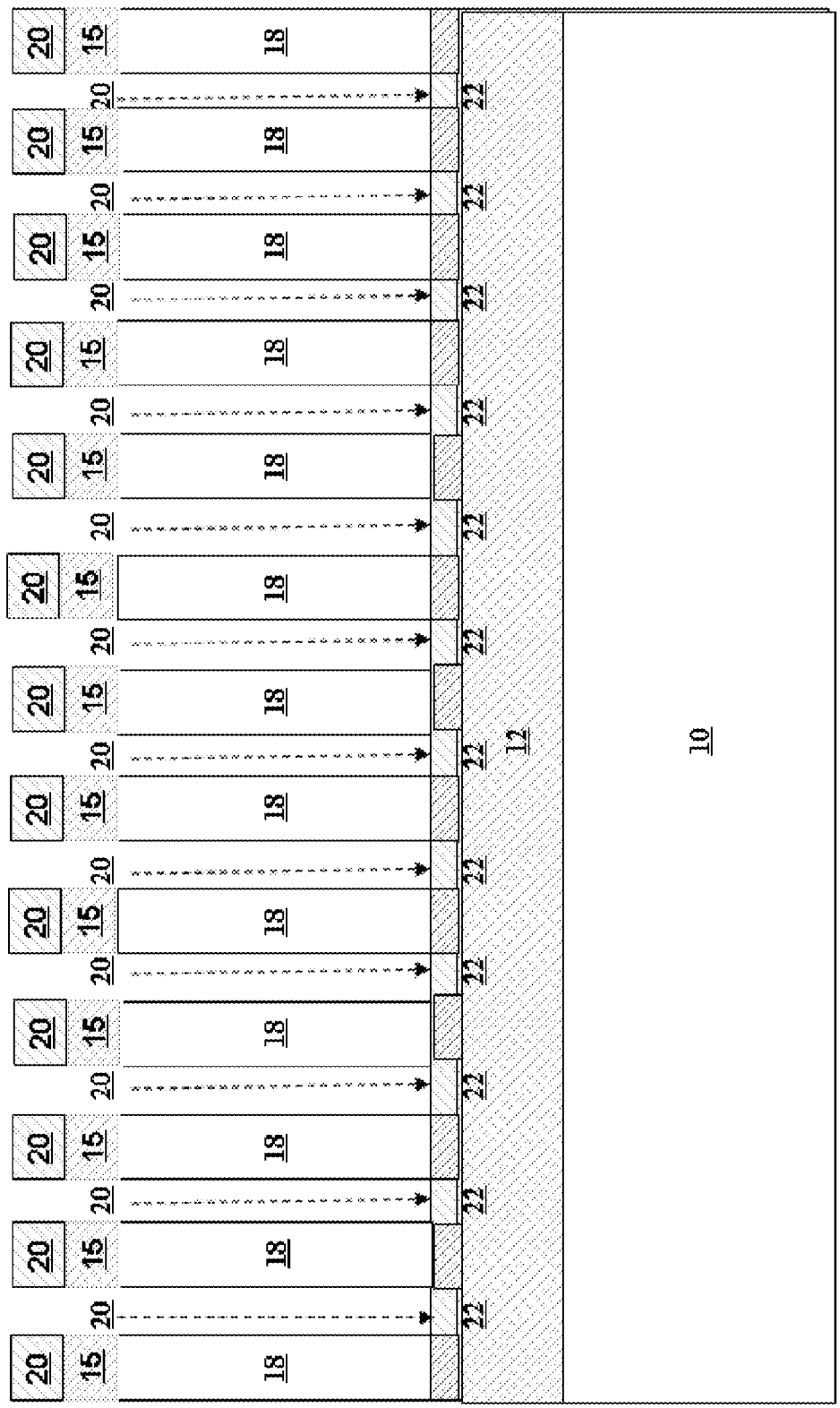
FIG. 8 illustrates a semiconductor structure in accordance with an embodiment of the present invention.

Referring now to FIG. 8, an embodiment of the present disclosure is shown. A FinFET device is shown with an insulator material layer 15 over the fins 18, and where nitride material 20 is deposited in the recesses 22 between spaces between each semiconductor fin 18. The nitride material 20 can be deposited by directional deposition, for example high density plasma deposition, such that it covers surfaces parallel to the plasma source, without causing excessive perpendicular deposition, i.e. minimizing deposition of nitride material along the sidewalls of the fins 18; and additionally, the nitride material 20 will be located in a plane beneath each bottom of each of the fins 18, allowing epitaxial deposition along the whole sidewall of the fin, which is beneficial for dopant distribution in the final device structure. The nitride material 20 can be any kind of silicon based nitride material, like $Si_xO_yN_z$. Preferably, the material will be silicon nitride, $Si_3N_4$.

The recessed portions 22 of the insulator 12 can be substantially recessed. Substantially recessed means that the recess of each of the recessed portions 22 is deep and wide enough so that the nitride material 20 deposited therein is either mostly or completely immersed in the insulator region 12. A complete immersion is where at least every portion of the bottom and side portions of the nitride material contacts the insulator layer 12, and the height of nitride material does not exceed the depth of the recesses 22.

In order to create the substantial recesses, an etch process can be employed. Preferably, the substantial recess will be obtained by performing an etch process such as anisotropic reactive ion etching to the insulator region 12, which permits a deep and one-dimensional recess without lateral widening of the recessed trench.

Figure 9:
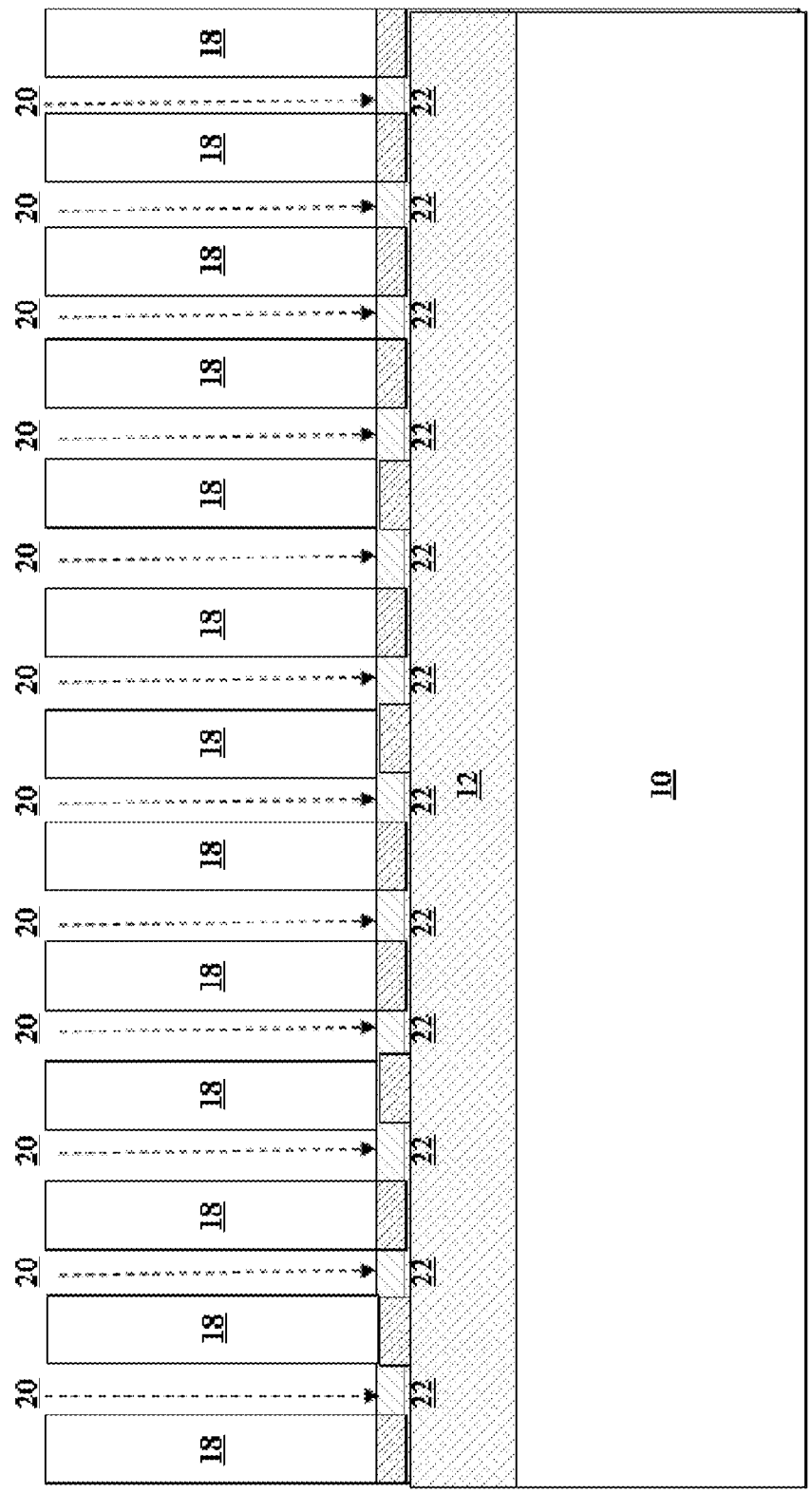
FIG. 9 illustrates a semiconductor structure in accordance with an embodiment of the present invention.

Referring now to FIG. 9, a removal process is employed on insulator material layer 15. The insulator layer can be removed, for example, using an etch process, such as aqueous hydro-fluoric acid (HF). The aqueous hydro-fluoric acid will etch the insulator material 15 from the top of the device shown in FIG. 8, and by extension, the nitride material 20 located on top of the insulator material 15 is lifted off the fins 18. The removal of the insulator material layer 15, and by extension the nitride material located on top of the insulator material layer 15, will result in the top of the fins 18 being exposed, i.e. the nitride material 20, does not cover the top of any of the fins 18.

The directional deposition of the nitride material 20 can be done, as stated, so that only a minimal portion of each of the sidewalls of the fins is contacted by the nitride material 20; however, there may be a need to further reduce this contact and a need to remove residue nitride material (not shown in Figures) occupying spaces between the fins, such that the nitride material makes no contact with the sidewall of the fins 18 or any other portion of the fins 18. This can be achieved by removing eventual residual nitride material from the sidewalls of the fins 18. The removal can be done by an etching process, such as isotropic reactive ion etching, or more preferably, a timed wet etch step. A non-limiting example for an wet etch is applying hot phosphoric acid to the nitride contacting the fin-sidewalls so that any nitride residue is removed therefrom.

Usually, there is no nitride residue present on the sidewalls. In cases where there is nitride residue on the fin sidewall, it is much thinner than the deposited nitride material 20 filling spaces between the fins 18. As such, the wet etch step may be timed, so it removes all eventual residual nitride material from the sidewalls, and ensures that no contact between the fins 18 and the nitride material 20 is present, but leaves a substantial amount of the deposited nitride material 20 intact.

Preferably, the removal will ensure that the nitride material 20 will directly-mechanically contact no more than half of the surface area of the sidewall of the fins 18, and even more preferably it will be such that the nitride material 20 makes no contact with the fins 18 whatsoever, as a result of being mostly or completely immersed in the substantially recessed portions of the insulator region 12.

By way of a non-limiting example, employing the above techniques to a device where the insulator layer has deeper recesses (as described above) and is a buried oxide layer with 145 nm in depth, the fins are 50 nm in height, the fin pitch is 40 nm, the spacing between the fins is 30 nm, some portions of the insulator that are recessed are 20 nm in depth, and the nitride material being deposited is 22 nm in initial depth, with a eventual nitride residue of about 1-2 nm on the sidewalls, can result in the recessed portions being totally filled by nitride material with an additional 1-2 nm contacting the fin sidewalls. The directional deposition will ensure that all or a substantial portion of the nitride material deposits in between the fins and in the recessed portion of the insulator, and eventual residual nitride on the sidewalls is further removed by the etch processes described above, for example the timed wet etch, which will remove 1-2 nm of deposited nitride material and all of the nitride residue. The result will be 20 nm of nitride material completely immersed in the 20 nm recess, thus making no mechanical contact with the fin sidewalls.

Figure 10:
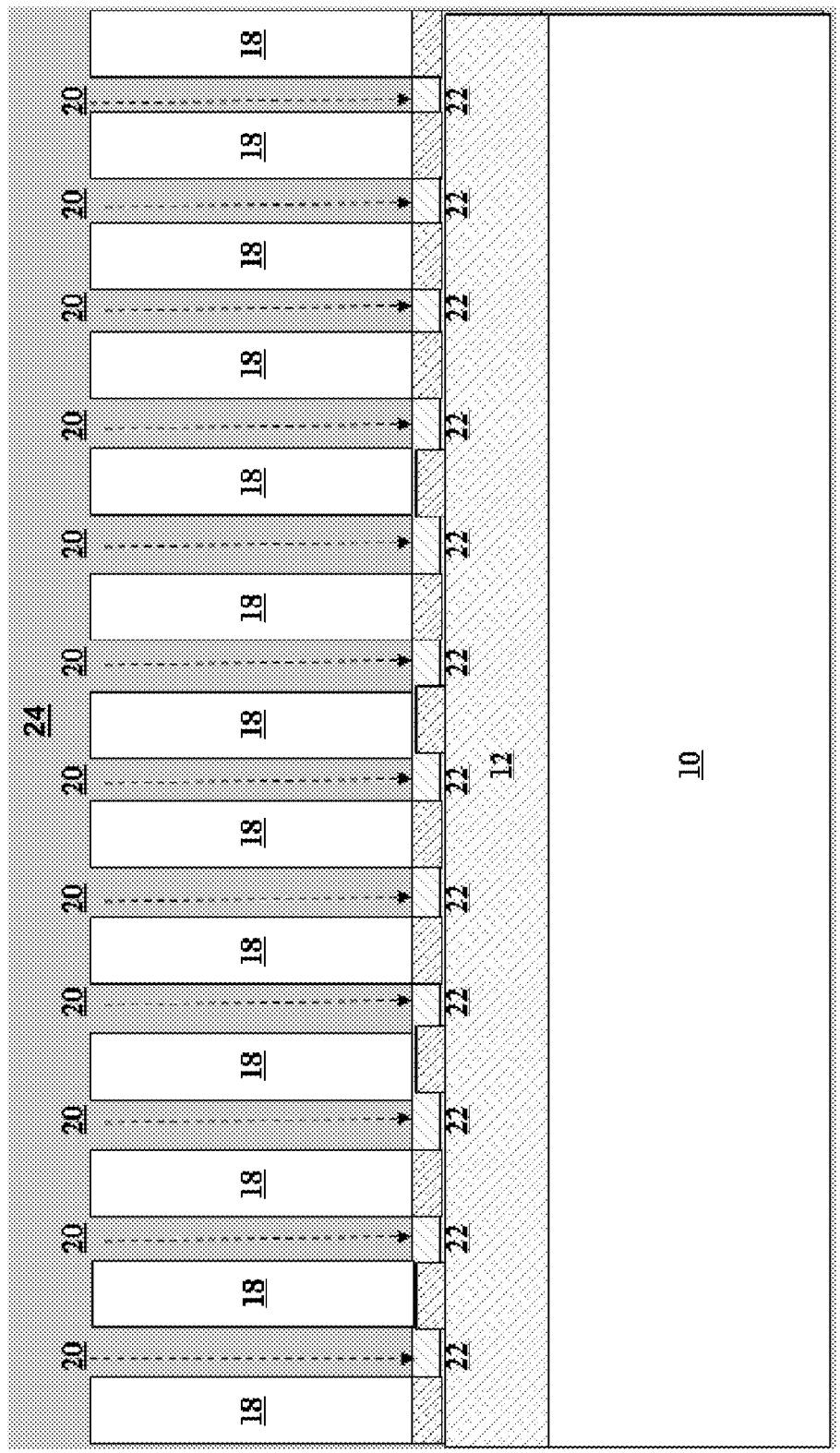
FIG. 10 illustrates a semiconductor structure in accordance with an embodiment of the present invention.

Referring now to FIG. 10, after the nitride material 20 is deposited, the fins 18 can be merged by an epitaxial material 24 using an epitaxial process. As stated above, the deposited nitride material 20 will prevent the formation of crystalline defects, such as dislocations or stacking faults, in the epitaxial material, as it grows along the nitride surface.

The embodiments of the present disclosure, as described herein, are applicable for various dimension of fin width, height, and pitch. For example, the fin width of the fins 18 can be between 4 nm-20 nm, and more preferably, the fin width can be between 6 nm-15 nm. By way of another example, the fin pitch of the plurality of fins can be between 20 nm to 50 nm. The insulator region 12 can be 145 nm in thickness and the fin height can be between 10 nm-60 nm. However, as stated, these dimensions, and any other dimensions used herein, are merely exemplary and other dimensions can work equally well in accordance with the teachings contained herein.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   providing a plurality of fins extending upwards from a surface of a buried insulator, wherein each fin of said plurality of fins contains an insulator material layer composed of an oxide on a topmost surface thereof;
   forming recesses in exposed portions of the buried insulator between adjacent fins of the plurality of fins, wherein said forming said recesses comprises an etch separate from an etch used to define said plurality of fins;
   filling the recesses with nitride material utilizing a directional deposition process, the directional deposition process further provides nitride portions; each nitride portion is located atop a corresponding fin, wherein said nitride portions atop adjacent fins are laterally separated from one another by a same distance by which adjacent fins of the plurality of fins are laterally separated, and
   wherein the nitride material does not contact a bottom of any one of the plurality of fins; removing residue nitride material from at least one sidewall of each of the plurality of fins;
   removing, at the same time and utilizing a lift-off etching process, the nitride portions and the insulator material layer atop the plurality of fins, while maintaining the nitride material within said recesses bare; and epitaxially growing a crystalline semiconductor merge material on exposed surfaces of the nitride material, the buried insulator, and the plurality of fins.

2. The method according to claim 1, wherein the nitride material is a silicon-nitride material.

3. The method according to claim 2, wherein the nitride material does not substantially mechanically contact any sidewall of each of the plurality of fins.

4. The method according to claim 3, wherein the etch step is an anisotropic reactive ion etch step.

5. The method according to claim 1, wherein, the nitride material is beneath a plane of a bottom of the plurality of fins.

6. The method according to claim 5, wherein the nitride material makes no mechanical contact with any of the plurality of fins.

7. The method according to claim 6, wherein the nitride material is substantially immersed in the buried insulator layer.

8. The method according to claim 7, wherein the removal of residue nitride material is performed by using a wet etch step.

9. The method according to claim 7, wherein the removal of residue nitride material is performed by an isotropic reactive ion etch step.

10. The method according to claim 7, wherein the substrate, the plurality of fins, the insulator layer, and the nitride material are located on a n-FET region.

11. The method according to claim 1, wherein fin pitch of the plurality of fins is between 20 nm to 30 nm, and wherein width of each fin of the plurality of fins is between 4 nm-20 nm.

* * * * *